US006996381B2

(12) United States Patent
Lee

(10) Patent No.: US 6,996,381 B2
(45) Date of Patent: Feb. 7, 2006

(54) APPARATUS AND METHOD FOR COMPENSATING TRANSMISSION POWER IN MOBILE TERMINAL

(75) Inventor: Chung Hee Lee, Seoul (KR)

(73) Assignee: LG Electronics, Inc., Seoul (KR)

( * ) Notice: Subject to any disclaimer, the term of this patent is extended or adjusted under 35 U.S.C. 154(b) by 475 days.

(21) Appl. No.: 10/264,698

(22) Filed: Oct. 4, 2002

(65) Prior Publication Data
US 2003/0068991 A1 Apr. 10, 2003

(30) Foreign Application Priority Data
Oct. 8, 2001 (KR) ................. 2001-61897

(51) Int. Cl.
H03C 1/62 (2006.01)
H04B 17/00 (2006.01)
H04B 1/04 (2006.01)

(52) U.S. Cl. ................. 455/115.1; 455/127.2

(58) Field of Classification Search .......... 455/127.1, 455/127.2, 126, 115.1, 115.2, 67.11, 67.14
See application file for complete search history.

(56) References Cited

U.S. PATENT DOCUMENTS 6,026,284 A   2/2000  Seo
6,191,653 B1 *  2/2001  Camp et al. ............... 330/129

FOREIGN PATENT DOCUMENTS

EP     0 412 392 A2  7/1990
WO     WO 01/11769 A1  2/2001

* cited by examiner

Primary Examiner—Nguyen T. Vo
(74) Attorney, Agent, or Firm—Lee, Hong, Degerman, Kang & Schmadeka

(57) ABSTRACT

An apparatus and a method for compensating transmission power in a mobile terminal compensate a gain control value of a transmission signal by comparing transmission powers by power steps of a reference channel to those of respective channels. For above object, there is provided a method for compensating transmission power in the mobile terminal comprising: a step of detecting gain control values and transmission powers by power steps of a reference channel; a step of detecting transmission powers by power steps of respective channels by applying the gain control values of the reference channel to the respective channels; and a step of calculating a calibration gain control value for controlling the transmission power by comparing the transmission powers by power steps of the reference channel to those of the respective channels.

11 Claims, 4 Drawing Sheets

FIG. 3

| POWER STEP | AGC VALUE | ADC VALUE |
|---|---|---|
| -46.92 | 161 | 16 |
| -40.60 | 183 | 25 |
| -35.27 | 200 | 38 |
| -29.94 | 215 | 47 |
| -24.62 | 230 | 56 |
| -19.29 | 246 | 70 |
| -13.97 | 262 | 81 |
| -8.64 | 278 | 90 |
| -4.01 | 293 | 101 |
| 1.32 | 306 | 109 |
| 6.64 | 317 | 120 |
| 11.97 | 333 | 128 |
| 16.99 | 349 | 140 |
| 22.32 | 364 | 160 |
| 26.34 | 393 | 169 |
| 32.97 | 414 | 180 |

FIG. 4

| POWER STEP | ADC VALUE(1) | ADC VALUE(2) | (2)-(1) |
|---|---|---|---|
| -46.92 | 18 | 16 | -2 |
| -40.60 | 23 | 25 | 2 |
| -35.27 | 35 | 38 | 3 |
| -29.94 | 48 | 47 | -1 |
| -24.62 | 58 | 56 | -2 |
| -19.29 | 67 | 70 | 3 |
| -13.97 | 80 | 81 | 1 |
| -8.64 | 90 | 90 | 0 |
| -4.01 | 102 | 101 | -1 |
| 1.32 | 110 | 109 | -1 |
| 6.64 | 121 | 120 | -1 |
| 11.97 | 130 | 128 | -2 |
| 16.99 | 140 | 140 | 0 |
| 22.32 | 158 | 160 | 2 |
| 26.34 | 170 | 169 | -1 |
| 32.97 | 182 | 180 | -2 |

APPARATUS AND METHOD FOR COMPENSATING TRANSMISSION POWER IN MOBILE TERMINAL

BACKGROUND OF THE INVENTION

1. Field of the Invention

The present invention relates to a mobile communication terminal, and particularly, to an apparatus and a method for compensating transmission power in a mobile communication terminal.

2. Description of the Background Art

FIG. 1 is a sketch showing a transmission block included in a mobile terminal.

As shown therein, the transmission block comprises a modem 100 and a transmission end 200.

The modem 100 modulates a digital signal into an analog signal, and the transmission end 200 controls gain of the analog signal outputted from the modem 100 according to a gain control signal (AGC value) of the modem 100 and outputs it to an antenna.

The transmission end 200 comprises an automatic gain controller (AGC) 20 for controlling gain of the analog signal (IF signal) according to the AGC value, a first SAW filter 21 filtering the IF signal of which gain is controlled, a mixer 22 for converting the filtered IF signal into a radio-frequency (RF) signal, a second SAW filter 23 filtering the RF signal, an amplifier for amplifying the filtered RF signal to be a predetermined level, and a duplexer 25 for outputting the amplified RF signal to the antenna.

Transmitting operation of the conventional mobile terminal as above will be described as follows.

The modem 100 converts the digital signal into an IF signal, that is, an analog signal and outputs the signal to the transmission end 200, and the AGC 20 of the transmission end 200 controls the gain of the IF signal according to the outputted AGC value.

The IF signal of which the gain is controlled is filtered in the first SAW filter 21, and after that, is converted into the RF signal. In addition, the RF signal is filtered in the second SAW filter 23, and is amplified in the amplifier to be a predetermined level. Therefore, the amplified RF signal is transmitted to a receiver via the duplexer 25 and the antenna (ANT).

Generally, the transmission block of the mobile terminal comprises passive components such as the first and the second SAW filters, and therefore, transmission power levels of the RF signals outputted from the transmission end by channels are differentiated by ripple characteristics of the passive components. Therefore, the modem 100 performs power calibration process for compensating the changes of power level on the transmission end by controlling the AGC 20 using a software.

However, since the transmission end of an IMT-2000 terminal has 12 channels and the respective channel has a plurality of power steps, it is actually impossible to perform the calibration processes for all power steps in all channels (12 channels) due to time limit.

Therefore, the modem 100 calculates AGC value differences of respective channels comparing to a reference channel for one power step in entire power section, and applies the corresponding AGC value to all power sections to perform the power calibration process.

Therefore, in the conventional art, the compensation values (AGC value) by respective channels are calculated for one power step, and the above compensation values are applied to remained power steps, and therefore, precise frequency compensation by respective channels and power levels can not be performed.

SUMMARY OF THE INVENTION

Therefore, an object of the present invention is to provide an apparatus and a method for compensating transmission power in a mobile communication terminal which are able to compensate power level changes of transmission signals effectively.

Another object of the present invention is to provide an apparatus and a method for compensating transmission power in a mobile communication terminal which are able to compensate level changes of transmission power by channels and by power steps.

To achieve these and other advantages and in accordance with the purpose of the present invention, as embodied and broadly described herein, there is provided an apparatus for compensating transmission power in a mobile terminal comprising: a transmission end for controlling gain of transmission signal and outputting the signal to an antenna; and a modem for detecting transmission power from the transmission end to a reference channel and to respective channels by power steps, and generating calibration gain control signals by respective power steps of the channels for controlling gain of the transmission signal.

Preferably, the modem comprises: a transmission power detecting unit for detecting power of the transmission signal outputted through the transmission end; and a calibration control unit tabulating the transmission power by power steps detected in the transmission power detecting unit and storing it in an inner memory.

Preferably, the transmission power detecting unit and the calibration control unit are realized in the modem as application specific integrated circuit (ASIC) forms.

To achieve the objects of the present invention, there is provided an apparatus for compensating transmission power in a mobile terminal comprising: a transmission end for controlling gain of a transmission signal and outputting the signal to an antenna; a transmission power detecting unit for detecting transmission signal power outputted through the transmission end; a calibration control unit for tabulating and outputting the transmission power by the power steps detected in the transmission power detecting unit; and a modem receiving the transmission powers of the reference channel and of the respective channels for a gain control signal by power steps of the reference channel from the calibration control unit and generating calibration gain control signals by power steps of respective channels.

Also, to achieve the objects of the present invention, there is provided a method for compensating transmission power in a mobile terminal comprising: a step of transmitting an analog signal through a transmission end; and a step of detecting transmission powers of the analog signal from the transmission end toward the reference channel and the respective channels, and generating compensation gain control signals by power steps of the respective channels for compensating power level changes of the analog signal.

Preferably, the step of generating the compensation gain control signal comprises: a step of detecting gain control value and transmission power of a reference channel by power steps; a step of detecting transmission power by power steps of the respective channels by applying the gain control value of the reference channel to the respective channels; and a step of calculating calibration gain control value for controlling the transmission power of the analog signal by comparing the transmission powers by the power steps of the reference channel with those of respective channels.

To achieve the objects of the present invention, there is provided a method for compensating transmission power in a mobile terminal comprising: a step of detecting gain control value and transmission power by power steps of a reference channel; a step of detecting transmission powers by the power steps of the respective channels by applying the gain control value of the reference channel to respective channels; and a step of calculating a calibration gain control value for controlling the transmission power by comparing the transmission powers by the power steps of the reference channel and the respective channels.

Preferably, the step of calculating the calibration gain control value comprises: a step of calculating difference value between the transmission powers of the reference channel and of the respective channels; a step of converting the calculated difference value into a gain control value; and a step of calculating the calibration gain control values by power steps of the respective channels by adding the converted gain control value to the gain control value of the reference channel.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3 is a view showing AGC values and ADC values by power steps for a reference channel in FIG. 2;

FIG. 4 is a view showing an example for calculating difference of ADC values by power steps for the reference channel and for respective channels in FIG. 2.

DETAILED DESCRIPTION OF THE PREFERRED EMBODIMENTS

Reference will now be made in detail to the preferred embodiments of the present invention, examples of which are illustrated in the accompanying drawings.

Figure 1:
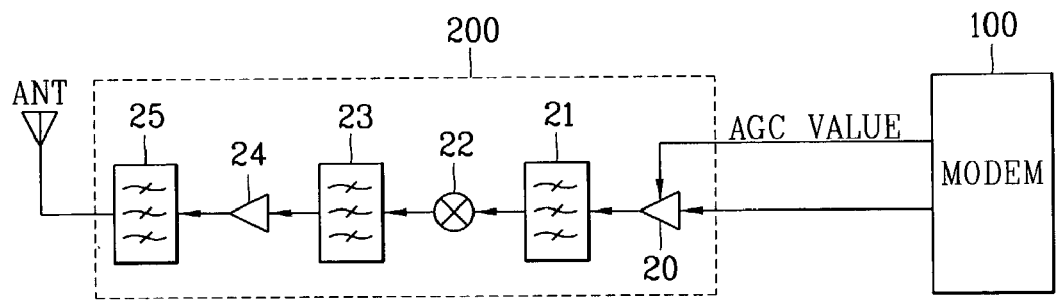
FIG. 1 is a block diagram showing a transmission block in a conventional mobile communication terminal.
Figure 2:
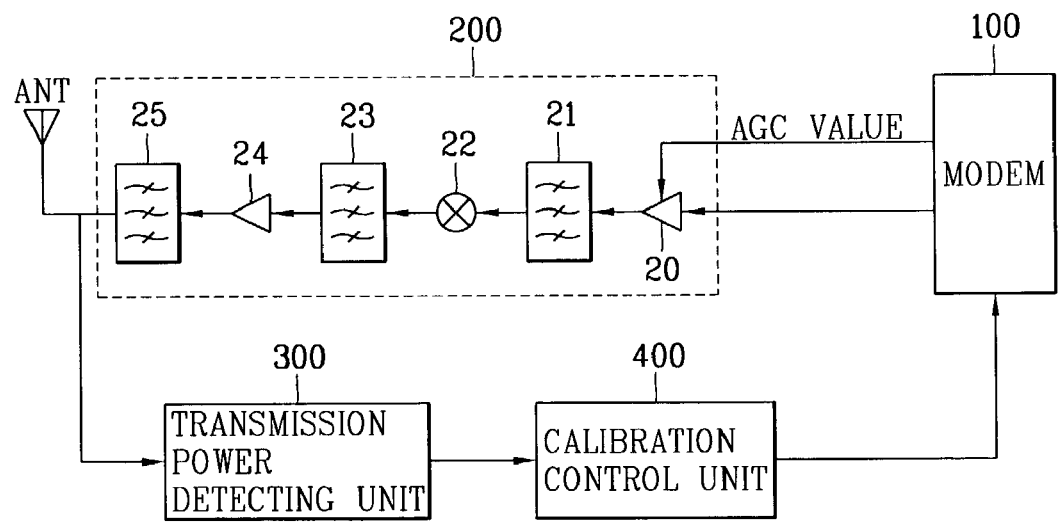
FIG. 2 is a block diagram showing an apparatus for compensating transmission power in a mobile terminal according to the present invention.

FIG. 2 is a block diagram showing an apparatus for compensating transmission frequency in a mobile terminal according to the present invention.

As shown therein, the apparatus for compensating transmission frequency according to the present invention further comprises a transmission power detecting unit 300 and a calibration control unit 400 besides a transmission block of the conventional mobile terminal comprising a modem 100 and a transmission end 200. At that time, for same components as those of the conventional art, same reference numerals are used.

The transmission power detecting unit 300 comprises an analog-to-digital converter (ADC) for converting an analog RF signal outputted from the transmission end 200 into a digital signal, and an amplifier for amplifying an output of the ADC to be a predetermined level and outputting the ADC value.

The calibration control unit 400 tabulates the ADC values by power steps detected by the transmission power detecting unit 300, and stores the values in an inner memory of the modem 100. At that time, the transmission power detecting unit 300 and the calibration control unit 400 may be realized as application specific integrated circuit (ASIC) forms in the modem 100.

Operations of the apparatus for compensating transmission frequency of the mobile terminal according to the present invention will be described in detail as follows.

The transmission end of an IMT-2000 terminal has 12 channels (CH1~CH12), and the respective channel has a predetermined band width. In the present invention, CH6 among those 12 channels is set as a reference channel. At that time, the reference channel may use other channels as needed.

When the reference channel is set, the modem 100 performs power calibration process for the reference channel (CH6) to store AGC values by power steps of the reference channel (CH6) representing desired transmission power in an inner memory. The transmission power detecting unit 300 detects the transmission power of the analog signal (RF signal) outputted through the transmission end 200 by the AGC value, and the calibration control unit 400 tabulates the transmission power detected by the transmission power detecting unit 300 and stores the power in the inner memory of the modem 100.

That is, the ADC of the transmission power detecting unit 300 converts the analog signal outputted through the transmission end 200 into the digital signal, and the amplifier amplifies the digital signal to be a predetermined level (0.5V~3V) and outputs the signal to the calibration control unit 400.

Therefore, the calibration control unit 400 tabulates the ADC values outputted form the amplifier by power steps and stores the ADC values (power level) in the inner memory. Consequently, as shown in FIG. 3, the AGC values and the transmission power (ADC value) of the reference channel (CH6) are stored in the inner memory of the modem 100 as table form.

Once the AGC values and the ADC values by power steps of the reference channel (CH6) are stored, the modem 100 applies the AGC values by power steps of CH6 to the CH1 to apply the transmission power of the analog signal. At that time, the transmission power detecting unit 300 and the calibration control unit 400 detect the ADC values of analog signal outputted through the transmission end 200 by power steps and stores the values in the inner memory.

After that, the above operation is repeatedly applied to remained channels (CH2~CH5, CH7~CH12) to detect the ADC values by power steps of respective channels and to store the values in the inner memory.

When the transmission powers by power steps of all channels are stored, the modem 100 subtracts the ADC values 1 by power steps of the CH6 from the ADC values 2 by power steps of the CH1 stored in the inner memory to calculate differences, as shown in FIG. 4, and calculates the differences by power steps between the reference channel and respective channels in same method as above.

In addition, the modem 100 converts the differences by power steps of respective channels into the AGC values, and after that, adds the converted AGC values to the AGC values of the reference channel (CH6) to calculate calibration AGC values for respective channels (CH1~CH5, CH7~CH12).

Therefore, the modem 100 controls the AGC 20 of the transmission end 200 using the calibration AGC values, and thereby, changes in transmission power level of the transmission end 200 caused by ripple characteristic of the passive components can be compensated precisely by respective channels and by power steps.

Figure 5:
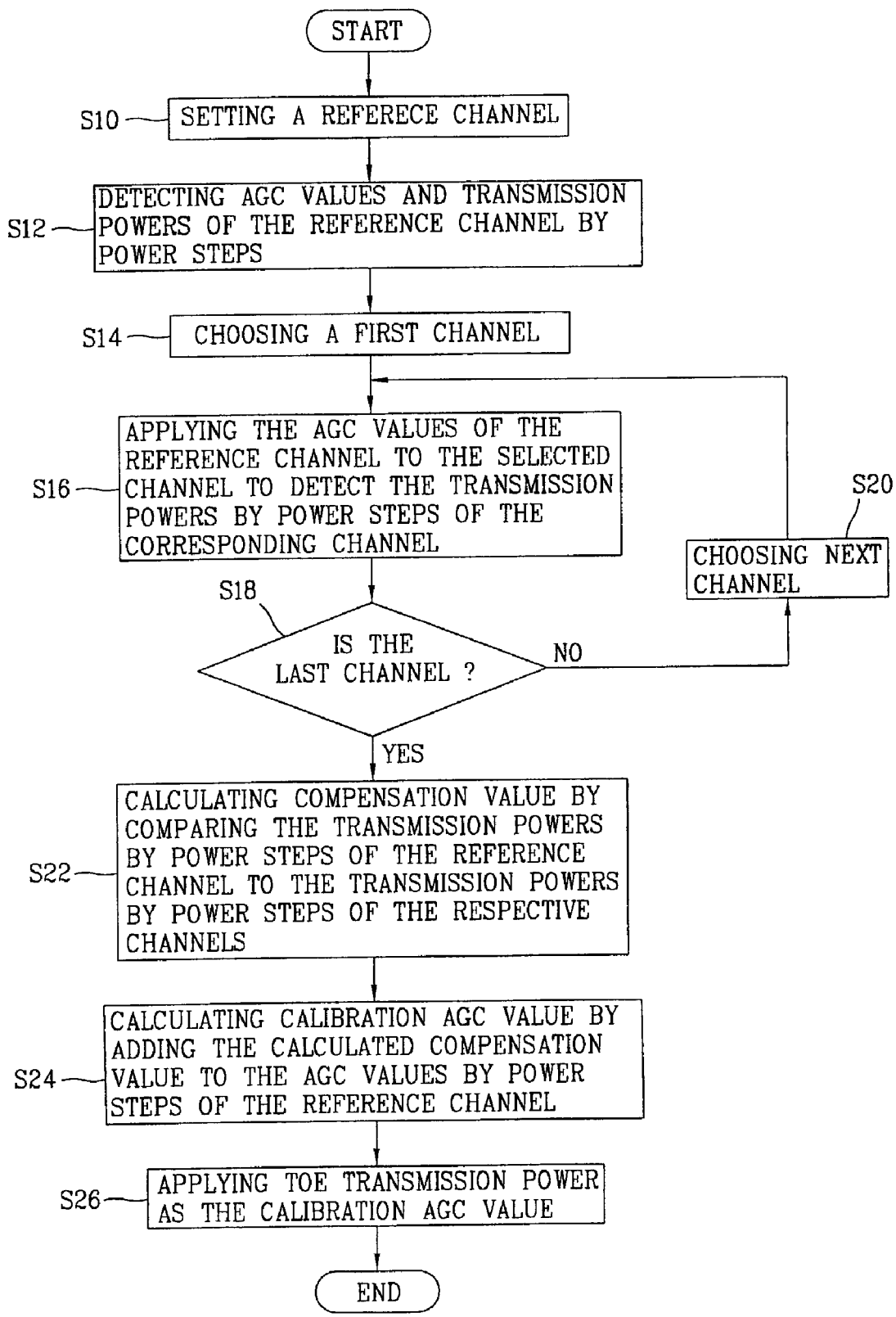
FIG. 5 is a flow chart showing a method for compensating transmission power of a mobile terminal according to the present invention.

Hereinafter, the operations will be described with reference to FIG. 5 as follows.

First, the modem 100 sets the reference channel (S10).

When the reference channel is set, the modem 100 performs calibration for the reference channel to store the AGC values of the transmission signal by power steps, and detects the power of the transmission signal actually outputted through the transmission end 200 according to the AGC value (S12).

When the AGC values and the power levels by power steps for the reference channel are stored, the modem 100 selects a first channel, and after that, applies the AGC values of the reference channel to the selected first channel to detect the transmission power of the transmission signal outputted through the transmission end 200 for the corresponding channel (S14, S16).

In addition, the operations for detecting the transmission powers by power steps for the remained channels are performed repeatedly (S16, S18, S20, S22).

After that, when the transmission power detecting for the last channel is completed, the modem 100 calculates compensation values by respectively subtracting the transmission powers by power steps of the reference channel from the transmission powers by power steps of the respective channels (S22). In addition, the modem 100 finally calculates calibration AGC values by power steps of the respective channels by adding the calculated compensation values to the AGC values by power steps of the reference channel (S24).

Therefore, the modem 100 controls the AGC 20 included in the transmission end 200 using the calibration AGC value to compensate the level changes of the transmission power caused by the ripple characteristic of the passive components (S26).

As described above, according to the present invention, the gain control values of the transmission signal are compensated by comparing the transmission powers by power steps of the reference channel to the transmission powers by power steps of the respective channels, and thereby, the level changes of the transmission power caused by the ripple characteristic of the passive components can be compensated by respective channels and by power levels precisely.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An apparatus for compensating transmission power in a mobile terminal comprising:
    a transmission end for controlling gain of a transmission signal and outputting the signal to an antenna; and
    a modem for detecting transmission power from the transmission end to a reference channel and to respective channels by power steps, and generating calibration gain control signals by respective power steps of the channels for controlling gain of the transmission signals, wherein the modem calculates differences between transmission powers by power steps of the reference channel and the transmission powers by power steps of the respective channels, and generates a calibration gain control signal by adding the above differences to the gain control values by power steps of the reference channel.

2. A mobile terminal performing a method for compensating transmission power, the mobile terminal comprising:
    a modem (100) adapted to modulate digital signals into analog signals that are outputted, and to output gain control signals having Automatic Gain Control values;
    a transmission end (200) adapted to receive said analog signals and said gain control signals, and to control a gain of said analog signals according to said gain control signals, and to output gain-controlled signals after processing;
    a transmission power detecting unit (300) adapted to detect transmission powers of said outputted gain-controlled signals according to the AGC values, and to output Analog-to-Digital Converter values after processing; and
    a calibration control unit (400) adapted to receive and store the ADC values according to different transmission power level increment steps that are to be used for a reference channel,
    wherein the modem (100), the transmission power detecting unit (300), and the calibration control unit (400) cooperate together to perform a calibration process comprising the steps of,
    setting the reference channel, performing a power calibration process for the reference channel, and storing the AGC values according to different transmission power level increment steps;
    selecting each remaining channel, and applying the stored AGC values of the reference channel to detect transmission powers of transmission signals output from the transmission end (200) for each remaining channel;
    calculating compensation values by respectively subtracting the transmission powers of the reference channel from the transmission powers of each remaining channel; and
    calculating calibration AGC values of each remaining channel by adding the calculated compensation values to the AGC values of the reference channel.

3. The apparatus of claim 1, wherein the transmission end (200) comprises an Automatic Gain Controller (20) that receives the analog signals and the gain control signals from the modem (100), and uses the calculated calibration AGC values for compensating output transmission power.

4. The apparatus of claim 1, wherein the transmission power detecting unit (300) and the calibration control unit (400) are implemented as an Application Specific Integrated Circuit within the modem (100).

5. The apparatus of claim 1, wherein the calibration control unit (400) stores the ADC values in a table format.

6. A method for compensating transmission power for a mobile terminal, the method comprising:
  modulating digital signals into analog signals that are outputted, and to output gain control signals having Automatic Gain Control values;
  receiving said analog signals and said gain control signals, and controlling a gain of said analog signals according to said gain control signals, and outputting gain-controlled signals after processing;
  detecting transmission powers of said outputted gain-controlled signals according to the AGC values, and outputting Analog-to-Digital Converter values after processing;
  receiving and storing the ADC values according to different transmission power level increment steps that are to be used for a reference channel; and
  performing a calibration process by,
  setting the reference channel, performing a power calibration process for the reference channel, and storing the AGC values according to different transmission power level increment steps;
  selecting each remaining channel, and applying the stored AGC values of the reference channel to detect transmission powers of the outputted gain-controlled signals for each remaining channel;
  calculating compensation values by respectively subtracting the transmission powers of the reference channel from the transmission powers of each remaining channel; and
  calculating calibration AGC values of each remaining channel by adding the calculated compensation values to the AGC values of the reference channel.

7. The method of claim 6, wherein the modulating step is performed by a modem (100), the receiving step is performed by a transmission end (200), the detecting step is performed by a transmission power detecting unit (400), the receiving and storing step is performed by a calibration control unit (400).

8. The method of claim 7, wherein the calibration process is performed by the modem (100), the transmission power detecting unit (300), and the calibration control unit (400) that cooperate together.

9. The method of claim 7, wherein the transmission end (200) comprises an Automatic Gain Controller (20) that receives the analog signals and the gain control signals from the modem (100), and uses the calculated calibration AGC values for compensating output transmission power.

10. The method of claim 8, wherein the transmission power detecting unit (300) and the calibration control unit (400) are implemented as an Application Specific Integrated Circuit within the modem (100).

11. The method of claim 8, wherein the calibration control unit (400) stores the ADC values in a table format.

* * * * *